(12) United States Patent
Sehgal et al.

(10) Patent No.: US 9,703,916 B2
(45) Date of Patent: Jul. 11, 2017

(54) STREAMING, AT-SPEED DEBUG AND VALIDATION ARCHITECTURE

(71) Applicant: Mentor Graphics Corporation, Wilsonville, OR (US)

(72) Inventors: Rajeev Sehgal, Noida (IN); Srinivas Mandavilli, Hyderabad (IN); Pradish Mathews, Noida (IN); Ajit Singh, Delhi (IN); Henry Potts, Ft. Collins, CO (US)

(73) Assignee: Mentor Graphics Corporation, Wilsonville, OR (US)

( * ) Notice: Subject to any disclaimer, the term of this patent is extended or adjusted under 35 U.S.C. 154(b) by 72 days.

(21) Appl. No.: 14/473,914

(22) Filed: Aug. 29, 2014

(65) Prior Publication Data

US 2015/0220677 A1 Aug. 6, 2015

(51) Int. Cl.
*G06F 17/50* (2006.01)

(52) U.S. Cl.
CPC .................. *G06F 17/5081* (2013.01)

(58) Field of Classification Search
CPC .................................................. G06F 17/5081
See application file for complete search history.

(56) References Cited

U.S. PATENT DOCUMENTS

2003/0131325 A1* 7/2003 Schubert et al. ............. 716/4
2005/0267730 A1* 12/2005 Kfir et al. .................. 703/26

* cited by examiner

*Primary Examiner* — Vuthe Siek
*Assistant Examiner* — Aric Lin
(74) *Attorney, Agent, or Firm* — Mentor Graphics Corporation

(57) ABSTRACT

This application discloses a computing system implementing tools and mechanisms that can incorporate a validation system into a circuit design. The validation system can be configured to monitor at least a portion of an electronic device described in the circuit design. The tools and mechanisms can identify one or more trace signals associated with the electronic device to route to the validation system, and identify one or more trigger signals associated with the electronic device to route to the validation system. The tools and mechanisms can configure the validation system to detect a conditional event corresponding a state of the one or more trigger signals, and to transmit the trace signals associated with the electronic device for debugging in response to the detected conditional event.

14 Claims, 8 Drawing Sheets

STREAMING, AT-SPEED DEBUG AND VALIDATION ARCHITECTURE

TECHNICAL FIELD

This application is generally related to electronic design automation and, more specifically, to streaming, at-speed debug and validation architecture.

BACKGROUND

Programmable logic devices, such as field-programmable gate arrays (FPGAs), include integrated circuitry capable of being configured after manufacture. The development of configurations for these programmable logic devices typically involves many steps, known as a "design flow." Initially, a specification for a new circuit can be transformed into a logical circuit design, sometimes referred to as a register transfer level (RTL) description of the circuit. With this logical circuit design, the circuit can be described in terms of both the exchange of signals between hardware registers and the logical operations that can be performed on those signals. The logical circuit design typically employs a Hardware Description Language (HDL), such as the Very high speed integrated circuit Hardware Description Language (VHDL). The functionality of the logical circuit design can be verified, for example, by simulating the logical circuit design with various test scenarios and verifying that the results of the simulation correspond with an expected output from the simulated logical circuit design.

The next stage of the "design flow" involves synthesizing the logical circuit design from the register transfer level into a gate-level representation, such as a netlist. The synthesis operations can include RTL synthesis, which can generate generic gates corresponding to the functionality described in the logical circuit design, and include physical synthesis, which can map the generic gates to a target programmable logic device, for example, generating a target device-specific netlist. The functionality of a gate-level netlist also can be verified, for example, by simulating the gate-level netlist with various test scenarios and verifying that the results of the simulation correspond with an expected output from the simulated gate-level netlist.

The next stage involves implementing a place-and-route process to determine the placement of elements from the gate-level netlist in the programmable logic device and the interconnections between those elements. The place-and-route process can generate a configuration file that, when downloaded to a programmable logic device, can cause the programmable logic device to implement the circuit design described by the gate-level netlist as configured by the place-and-route process.

Since simulation during the "design flow" often fails to catch all design bugs or flaws, most "design flows" include in-system debugging and validation to monitor operation of the configured programmable logic devices—typically with special debugging tools that probe and monitor an FPGA's internal signals at system-clock speed—and detect and output any aberrant behavior via a Joint Test Action Group (JTAG) port of the programmable logic devices. When aberrant behavior is detected, the circuit designers attempt to correlate the aberrant behavior to bugs in the logical circuit design, revise the logical circuit design at the RTL-level to remove the bugs, and iterate the "design flow" with the newly revised logical circuit design, i.e., re-performing synthesis, place-and-route, verification via simulation, and programmable logic device configuration. While this iterative-based design approach can validate some designs configured into an FPGA, it often comes at the cost of large footprint consumption on the FPGA under test, excessive manual intervention, and long design-time when there are a large number of iterations. In other cases, due to lack of visibility of internal signals by the special debugging tools, bugs in the design cannot be eliminated and the circuit designers re-start the "design flow" altogether.

SUMMARY

This application discloses a computing system implementing tools and mechanisms that can incorporate a validation system into a circuit design. The validation system can be configured to monitor at least a portion of an electronic device described in the circuit design. The tools and mechanisms can identify one or more trace signals associated with the electronic device to route to the validation system, and identify one or more trigger signals associated with the electronic device to route to the validation system. The tools and mechanisms can configure the validation system to detect a conditional event corresponding a state of the one or more trigger signals, and to transmit the trace signals associated with the electronic device for debugging in response to the detected conditional event.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads.

Figure 1:
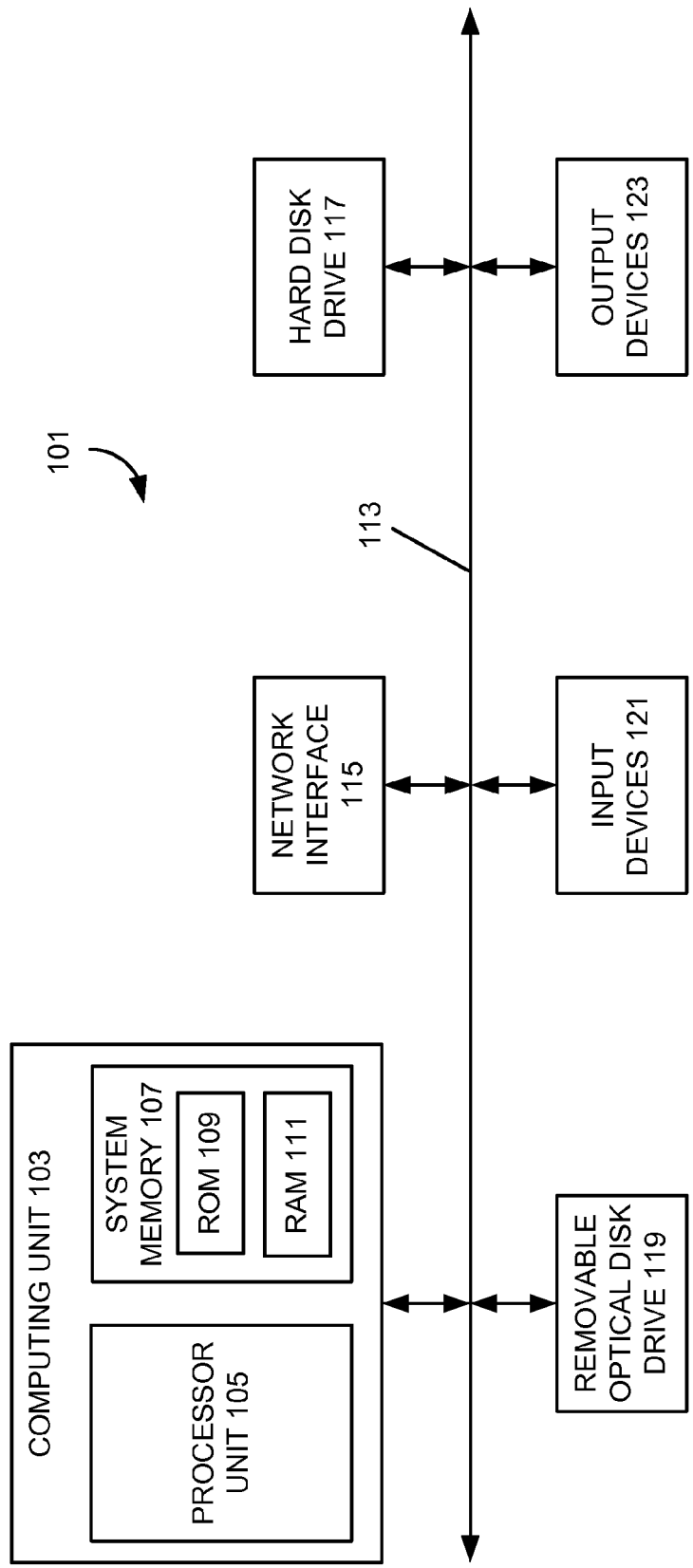
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
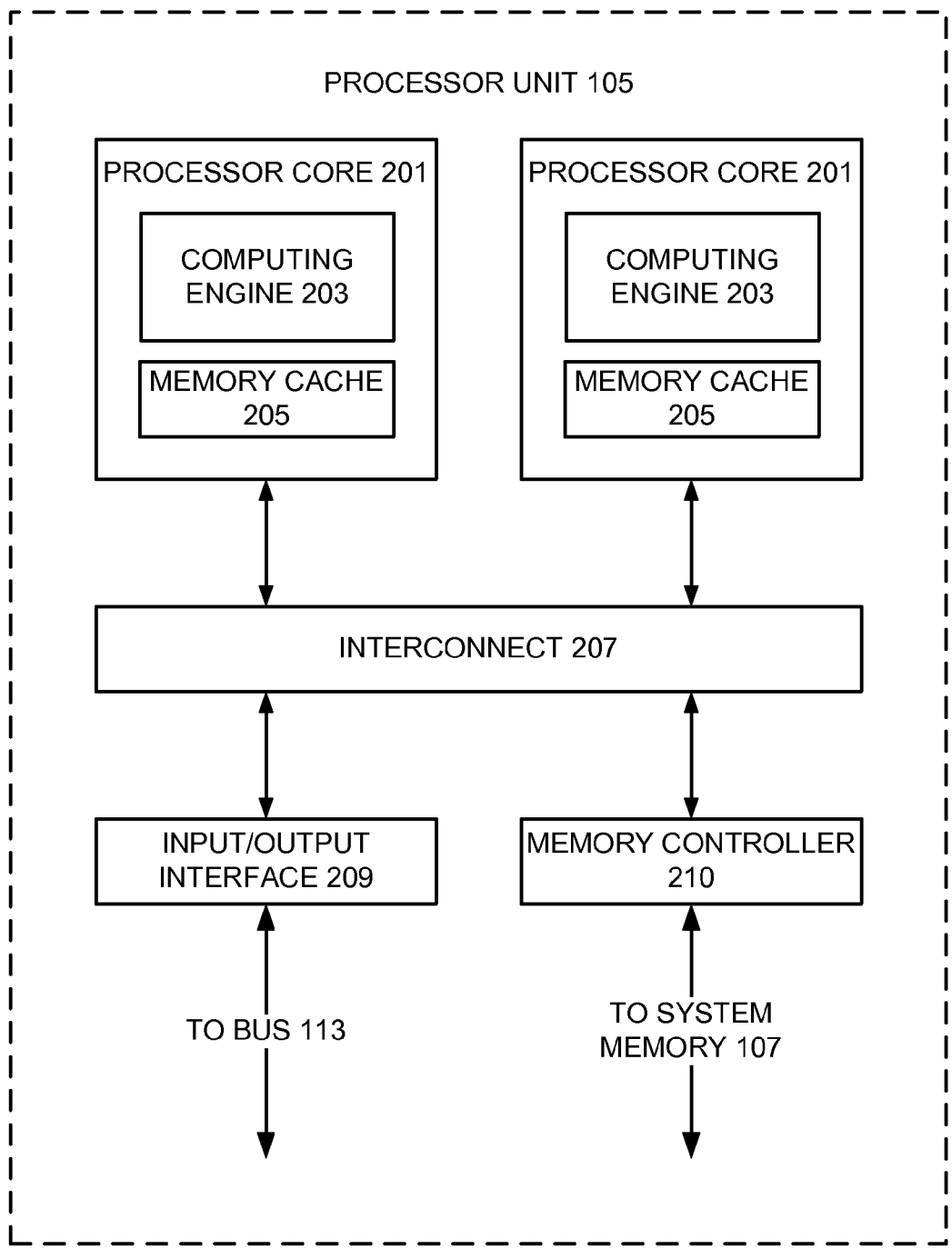

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Validation Design Environment

Figure 3:
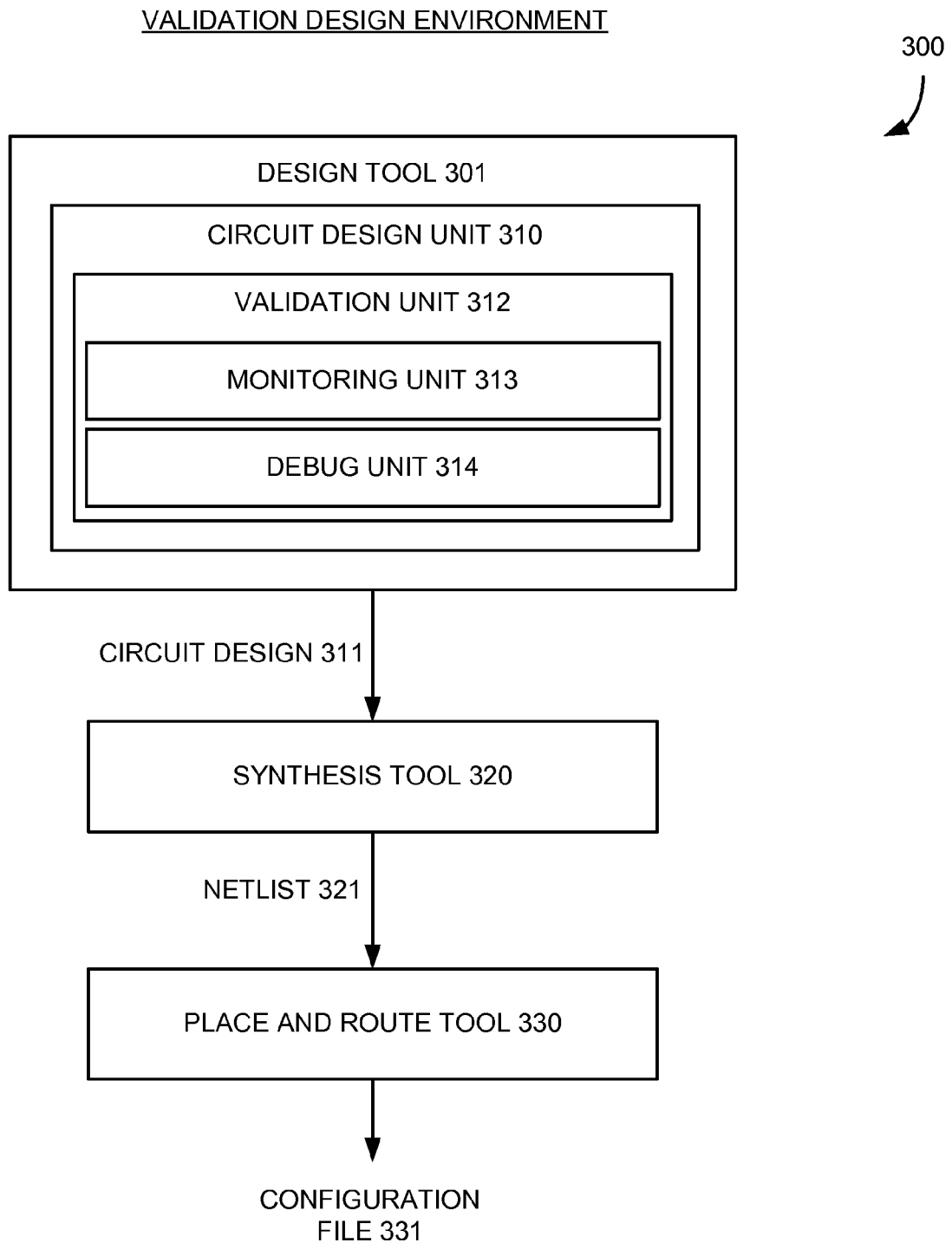
FIG. 3 illustrates an example of validation design environment including a design automation tool that can incorporate a validation system into a circuit design according to various embodiments of the invention.

FIG. 3 illustrates an example of validation design environment 300 including a design automation tool 301 that can incorporate a validation system into a circuit design 311 according to various embodiments of the invention. Referring to FIG. 3, the design tool 301 can include a circuit design unit 310 to generate the circuit design 311, which can describe an electronic device both in terms of an exchange of data signals between components in the electronic device, such as hardware registers, flip-flops, combinational logic, or the like, and in terms of logical operations that can be performed on the data signals in the electronic device. The circuit design 311 can model the electronic device at a register transfer level (RTL), for example, with code in a Hardware Description Language (HDL), such as Verilog, Very high speed integrated circuit Hardware Description Language (VHDL), or the like. In some embodiments, the design tool 301 can receive the circuit design 311 from a source external to the design tool 301, such as a user interface of the computing device 101, another tool implemented by the computing device 101.

In some embodiments, the design tool 301 (or another tool in the validation design environment 300) can simulate the circuit design 311 with a test bench. The test bench, during simulation, can generate a set of test stimuli capable of being utilized to functionally verify the circuit design 311, for example, by providing test scenarios to determine whether the circuit design 311 can function as expected. In some embodiments, the design tool 301 (or another tool in the validation design environment 300) can receive the test bench from a source external to the design tool 301, such as a user interface of the computing device 101, another tool implemented by the computing device 101, or the design tool 301 may internally generate the test bench. The design tool 301 can generate waveform data, which can correspond to a simulated output created by the circuit design 311 during simulation with the test bench. The design tool 301 (or another tool in the validation design environment 300) can perform functional verification for the circuit design 311, for example, by comparing the waveform data with an expected output from the circuit design 311 in response to test stimuli generated by the test bench during simulation.

The circuit design unit 310 can include a validation unit 312 to incorporate a validation system into the circuit design 311. The validation system, as described in the circuit design 311, can be configured to monitor operation of the electronic device and selectively output monitored data for debugging operations. The design tool 301 can output the circuit design 311 embedded with the validation system for further transformation on a design flow towards implementation in a programmable logic device.

The validation unit 312 can include a monitoring unit 313 to configure the validation system in the circuit design 311, for example, by defining which signal(s) the validation system receives and what operations the validation system performs based on the received signal(s). In some embodiments, the monitoring unit 313 can configure the validation system to receive one or more trace signals, for example, from a portion of the electronic device described in the circuit design 311, and record the trace signals in a buffer or other memory device. The monitoring unit 313 can configure the validation system to receive one or more trigger signals, for example, from a portion of the electronic device described in the circuit design 311. The trace signals and the trigger signals can include packetized communication, binary data, power signaling, clock signaling, or any other signal generated, received, transmitted, or exchanged by the electronic device.

The monitoring unit 313 also can configure the validation system to implement debug logic, for example, which can perform pattern detection or meta-stability glitch detection on the trigger signals. For example, the debug logic can review the received trigger signals to determine whether the trigger signals include a specific signature or embedded bit stream, whether the trigger signals are set in a particular state, whether the trigger signals have transitioned between a particular set of states in a preset order or with a preset timing, or any other discernable trigger signal pattern. The monitoring unit 313 can configure the validation system to forward at least a portion of the recorded trace signals for debugging operations in response to detecting of a pattern, a meta-stability glitch, or another trigger event by the debug logic. The monitoring unit 313 also can define additional interconnections for the validation system, such as interconnections to input/output ports of the programmable logic device, interconnections between different internal components of the validation system, or the like. Embodiments of validation system configuration will be described below in greater detail.

The validation design environment 300 can include a synthesis tool 320 to receive the circuit design 311 from the design tool 301 and synthesize the circuit design 311 from the register transfer level representation into a gate-level representation, such as into a netlist 321. In some embodiments, the synthesis tool 320 can perform a generic synthesis—generating generic gates corresponding to the functionality described in the circuit design 311—and then perform a physical synthesis that maps the generic gates to a target programmable logic device. In some embodiments, the synthesis tool 320 (or a tool external to the synthesis tool 320) can functionality verify the netlist 321, for example, by simulating the netlist 321 with various test scenarios and verifying that the results of the simulation corresponds with an expected output from the netlist 321 in response to test stimuli generated during simulation.

The validation design environment 300 can include a place and route tool 330 to determine placement of elements from the netlist 321 in the programmable logic device and the interconnections between those elements. The place and route tool 330 can generate a configuration file 331 that, when downloaded to the programmable logic device, can cause the programmable logic device to implement the functionality described in the circuit design 311. The programmable logic device can include a field programmable gate array (FPGA) architecture, an application specific integrated circuit (ASIC) architecture, a system-on-a-chip (SOC) architecture, or the like.

The programmable logic device, as programmed with the configuration file 331, can include both the electronic system and the validation system. As discussed above, the validation system can be configured to monitor operation of the electronic device in the programmable logic device and selectively output monitored data for debugging operations. For example, the validation system can receive trace signal(s) and trigger signal(s) from the electronic device, utilize debug logic to determine whether the trigger signals correspond to a trigger event, and output debug data from the programmable logic device in response to the trigger event.

Since, in some embodiments, the validation system can utilize one or more general input/output pins of the programmable logic device to output the debug data, which can be routed back to the validation unit 312 of the design tool 301, the validation unit 312 can include a debug unit 314 to perform the debugging operations based on the debug data routed from the programmable logic device. For example, the debug unit 314 can prompt presentation of the debug data along with information corresponding to the trigger event that prompted the validation system to output the debug data. In some embodiments, the debug logic in the validation system can be dynamically programmable, for example, after the programmable logic device has been configured with the circuit design 311. The debug unit 314 can generate a trigger configuration, which can include a configuration for the debug logic of the validation system, and provide the trigger configuration to the validation system configured in the programmable logic device. The trigger configuration can program (or re-program) the debug logic on-the-fly during debug operations. Embodiments of the dynamic trigger configuration will be described below in greater detail.

Debug and Validation Environment

Figure 4:
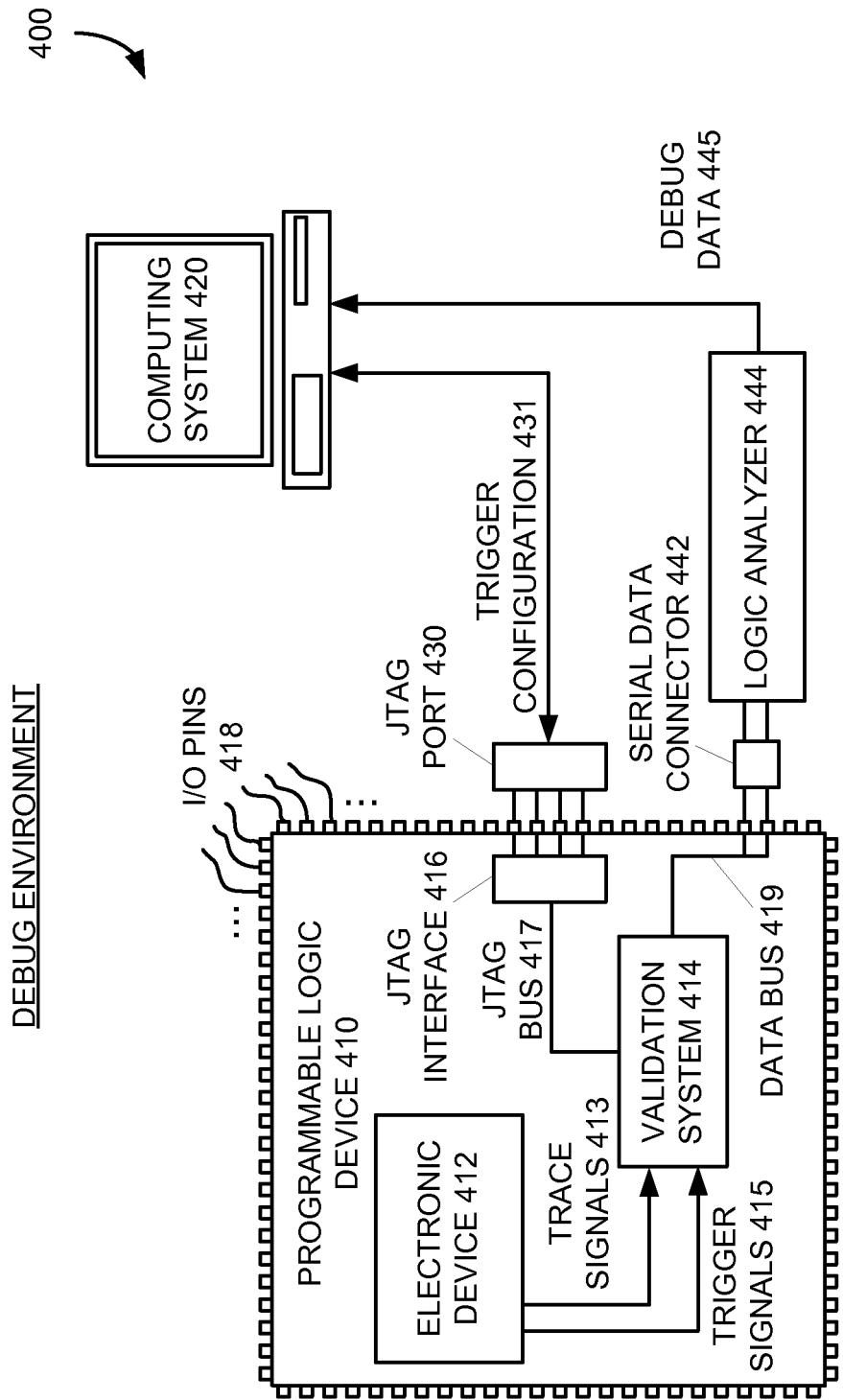
FIG. 4 illustrates an example debug and validation environment including a programmable logic device configured with a validation system according to various examples of the invention.

FIG. 4 illustrates an example debug and validation environment 400 including a programmable logic device 410 configured with a validation system 414 according to various examples of the invention. Referring to FIG. 4, the programmable logic device 410 can be configured to include an electronic device 412 and the validation system 414, which can be configured to receive various signals from the electronic device 412, such as trace signals 413 and trigger signals 415. The programmable logic device 410 can include a field programmable gate array (FPGA) architecture, an application specific integrated circuit (ASIC) architecture, a system-on-a-chip (SOC) architecture, or the like.

The validation system 414 can include debug logic (not shown) to analyze the trigger signals 415, for example, to identify occurrences of one or more trigger events. In some embodiments, the trigger events can correspond to a pattern or meta-stable glitch detected in the trigger signals 415. In response to identifying an occurrence of a trigger event, the validation system 414 can output at least a portion of the trace signals 413, for example, via a set of one or more input/output (I/O) pins 418. In some embodiments, the validation system 414 can packetize at least a portion of the trace signals 413, optionally including a timestamp, and place the trace signal packets on a data bus 419 to output through the set of I/O pins 418.

The debug environment 400 can include a computing system 420 to implement a tool having debug functionality, which can receive and analyze the trace signal packets output from the validation system 414. The debug environment 400 can include a serial data connector 442 to couple to the set of the I/O pins 418 of the programmable logic device 410 and include a logic analyzer 444 to extract data corresponding to the trace signals 413 output by the validation system 414 via the I/O pins 418. The logic analyzer 444 can forward the extracted data as debug data 445 to the computing system 420 for debugging operations. The computing system 420 can present the debug data 445 for review and allow alteration of the circuit design utilized in the design flow that configured the programmable logic device 410. When the circuit design is altered, the computing system 420 can iterate through the design flow, i.e., re-synthesize the altered circuit design, re-perform the place-and-route process, and then re-configure the programmable logic device 410 with the new configuration file.

The computing system 420 also can dynamically configure (and reconfigure) portions of the programmable logic device 410 without having to iterate through the design flow, i.e., not having to re-perform synthesis and place-and-route operations in order to alter the configuration of the programmable logic device 410. In some embodiments, the validation system 414 in the programmable logic device 410 can include reconfigurable debug logic, for example, which can implement programmable trigger signal analysis in response to a trigger configuration 431 from the computing system 420.

In some embodiments, the validation system 414 can receive the trigger configuration 431 from the computing system 420, for example, via a Joint Test Action Group (JTAG) bus 417 and a JTAG interface 416 configured in the programmable logic device 410. For example, the computing system 420 can send the trigger configuration 431 to the programmable logic device 410 via a JTAG port 430, and the programmable logic device 410 can forward the trigger configuration 431 to the validation system 414 via the JTAG interface 416 and the JTAG bus 417. This re-configuration of the programmable logic device 410 can allow the validation system 414 to be dynamically reconfigurable while the programmable logic device 410 performs operations at run-time.

Figure 5:
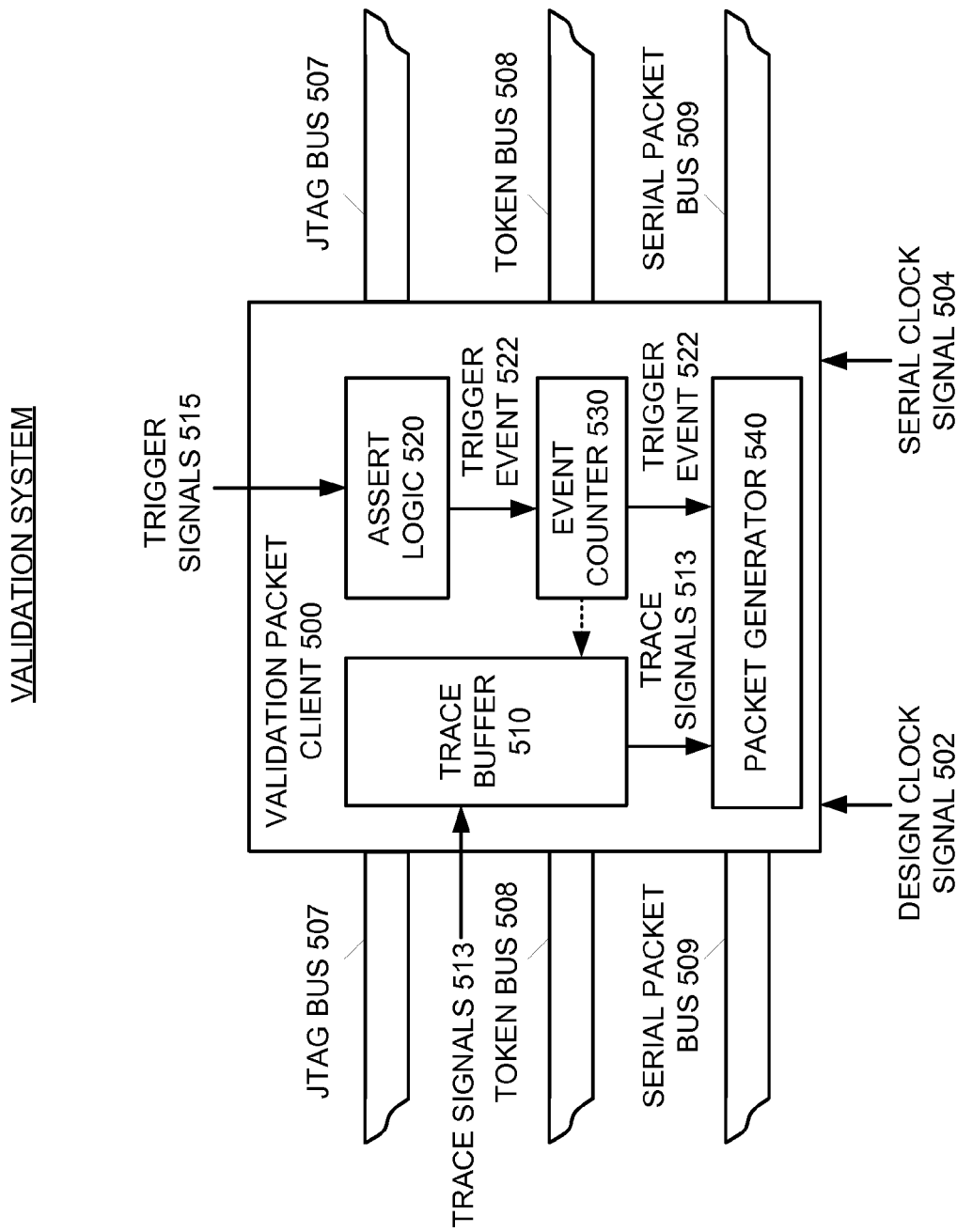
FIG. 5 illustrates an example implementation of a validation system according to various embodiments of the invention.

FIG. 5 illustrates an example implementation of a validation system according to various embodiments of the invention. Referring to FIG. 5, the validation system can include a validation packet client 500 to detect occurrences of trigger events 522 from trigger signals 515 received from an electronic device, and, in response to the trigger events 522, output packet signals that include data from trace signals 513 received from the electronic device. The validation packet client 500 can receive a design clock signal 502, for example, corresponding to the speed at which the electronic device in the programmable logic device operates, which can allow the validation packet client 500 to operate at-speed of the electronic device, i.e., receive and process stimulus, such as trace signals 513 and trigger signals 515, in real-time.

The validation packet client 500 can include a trace buffer 510 to record one or more trace signals 513 received from the electronic device. The trace signals 513 can include packetized communication, binary data, power signaling, clock signaling, or any other signal generated, received, transmitted, or exchanged by the electronic device. In some embodiments, the trace buffer 510 can implement a First-In-First-Out (FIFO) buffer, which can be configured to delete or overwrite recorded trace signals 513 when the trace buffer 510 is full and new trace signals 513 are received by the validation packet client 500.

The validation packet client 500 can include assert logic 520 to analyze one or more trigger signals 515 received from the electronic device. The trigger signals 515 can include packetized communication, binary data, power signaling, clock signaling, or any other signal generated, received, transmitted, or exchanged by the electronic device. The assert logic 520 can be configured to identify trigger events 522 in response to the trigger signals 515, and annunciate a detection of the trigger event 522 to other portions of the validation packet client 500, such as an event counter 530. In some embodiments, the assert logic 520 can review the received trigger signals 515 to determine whether the trigger signals 515 include a specific signature or bit-pattern, whether the trigger signals 515 enter a particular state, whether the trigger signals 515 have transitioned between a particular set of states in a preset order or with a preset timing, or any other discernable trigger signal pattern.

In some embodiments, the assert logic 520 can be configured (or dynamically re-configured) by trigger configuration, for example, receive from a Joint Test Action Group (JTAG) bus 507. The trigger configuration can prompt a configuration or re-configuration of the assert logic 520, which can redefine what constitutes an occurrence of a trigger event 522 in response to the trigger signals 515. The validation packet client 500, in some embodiments, can couple to the JTAG bus 507 in a serial-pipelined-fashion, for example, the validation packet client 500 can receive information from one section of the JTAG bus 507, analyze the information to determine whether it is destined for the validation packet client 500, and selectively forward the information to another section of the JTAG bus 507 based on the analysis.

The validation packet client 500 can include a packet generator 540 to generate packet signals from the trace signals 513 stored in the trace buffer 510, for example, in response to the assert logic 520 detecting a trigger event 522. In some embodiments, the event counter 530 can annunciate a detection of the trigger event 522 to the packet generator 540, which can prompt the packet generator 540 to initiate generation of the packet signals with the trace signals 513 stored in the trace buffer 510. The event counter 530 also can annunciate detection of the trigger event 522 to the trace buffer 510, which can prompt the trace buffer 510 to capture or preserve a set of one or more trace signals 513 for use by the packet generator 540. In some embodiments, the annunciation of the trigger event 522 can preserve one or more of the trace signals 513 currently recorded in the trace buffer 510, possibly having the trace buffer 510 ceasing to record newly received trace signals 513.

The validation packet client 500 can output the packet signals on a serial packet bus 509 based, at least in part, on a serial clock signal 504 received by the validation packet client 500. The validation packet client 500, in some embodiments, can couple to the serial packet bus 509 in a serial-pipelined-fashion, for example, the validation packet client 500 can pass received data between different sections of the serial packet bus 509 and selectively insert the generated packet signals onto the serial packet bus 509. In some embodiments, when the serial packet bus 509 is a shared resource, the validation packet client 500 can access the serial packet bus 509 based on an arbitration scheme. For example, access to the serial packet bus 509 can be token-based, i.e., when the validation packet client 500 can insert packet signals on the serial data bus 509 when in possession of a token. In some embodiments, the token can be passed between devices capable of controlling the serial access bus 509 via a dedicated token 508 bus or even through the serial packet bus 509 itself. The validation packet client 500, in some embodiments, can couple to the token bus 508 in a serial-pipelined-fashion, for example, the validation packet client 500 can receive a token from the token bus 508, hold it while utilizing the serial packet bus 509, and then send the token out on the token bus 508.

Figure 6:
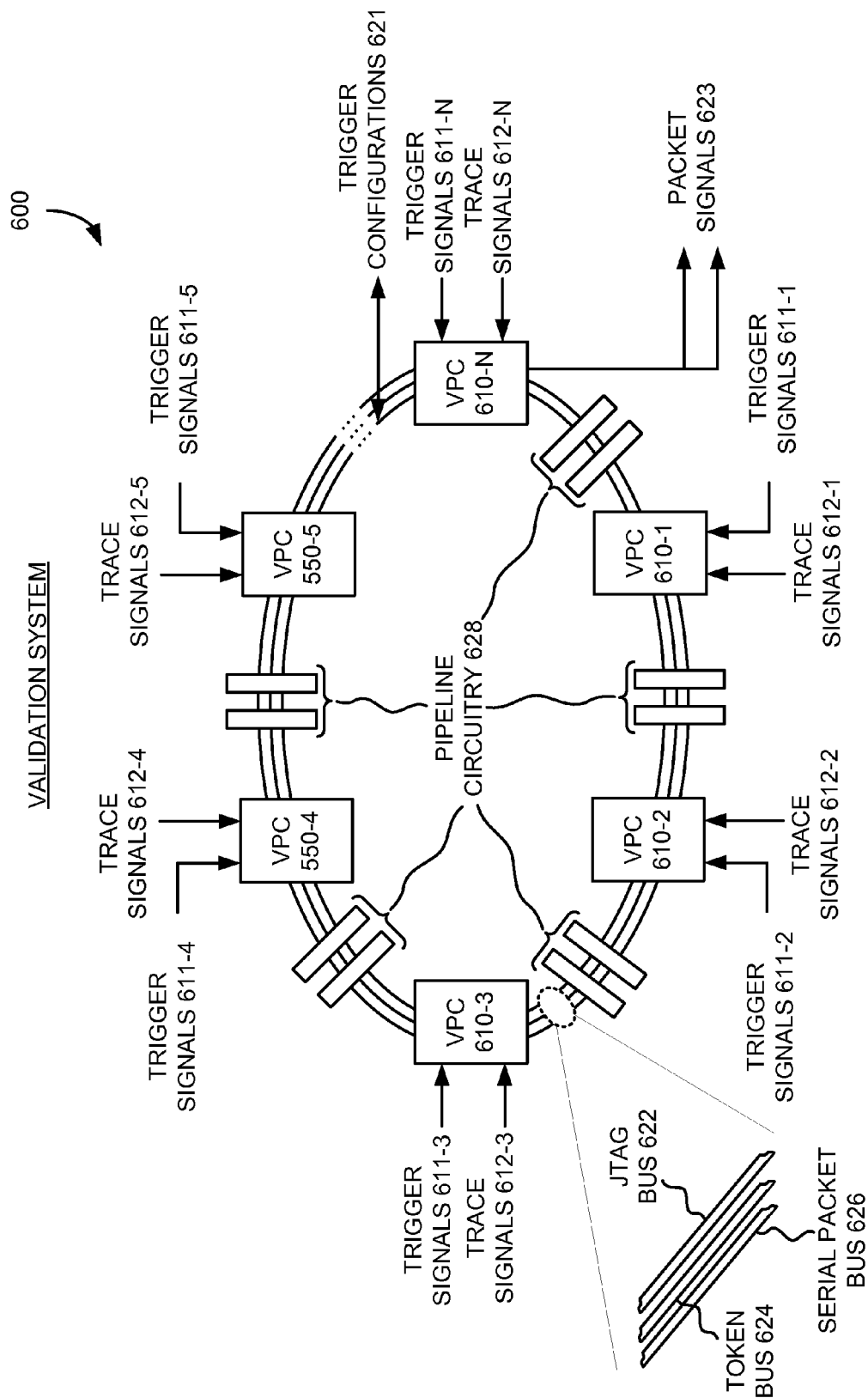
FIG. 6 illustrates another example implementation of a validation system according to various examples of the invention.

FIG. 6 illustrates another example implementation of a validation system 600 according to various examples of the invention. Referring to FIG. 6, the validation system 600 can include multiple validation packet clients 610-1 to 610-N configured in a serial-pipelined-fashion, each having access to a JTAG bus 622, a token bus 624, and a serial packet bus 626. Each validation packet clients 610-1 to 610-N can be configured similarly to the validation packet client 500 described above in FIG. 5 except that each of them can be configured to receive different or various trigger signals 611-1 to 611-N, respectively, receive different or various trace signals 612-1 to 612-N, respectively, and include different or various assert logic programming. In other words, each of the validation packet clients 610-1 to 610-N can selectively forward different trace signals 612-1 to 612-N as packet signals 623 for debugging operations in response to different trigger events.

The validation system 600 can include pipeline circuitry 628 interleaved between the validation packet clients 610-1 to 610-N, which can allow the flow of trigger configurations 621 and tokens to traverse to any of the validation packet clients 610-1 to 610-N, while also allowing packet signals 623 from each of the validation packet clients 610-1 to 610-N to be output from the validation system 600, for example, via validation packet client 610-N.

Figure 7:
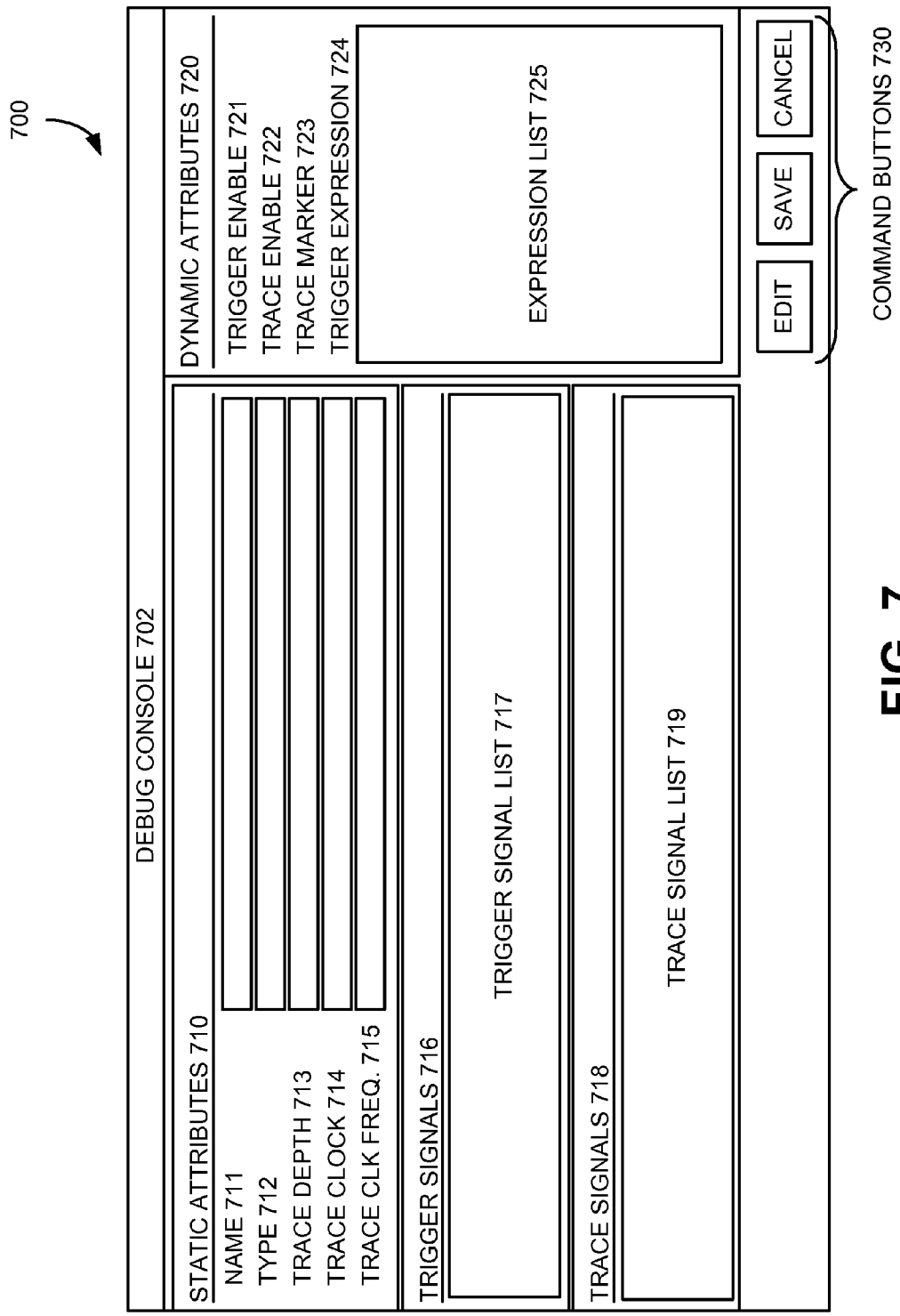
FIG. 7 illustrates an example implementation display window for configuring an example validation system according to various embodiments of the invention.

FIG. 7 illustrates an example implementation display window 700 for configuring an example validation system according to various embodiments of the invention. Referring to FIG. 7, the display window 700 can include a display console 702, which can include user-definable attributes of a validation system. For example, the display console 702 can include a static attributes section 710 including fields that can define static attributes of the validation system, and include a dynamic attributes section 720 including fields that can define dynamically-adjustable attributes of the validation system. The debug console 702 can include a set of command buttons 730, which can allow a user to edit a current attribute set for a validation packet client, and save or cancel any alterations to the current attribute set for the validation packet client.

The static attributes 710 can correspond to those portions of the validation system configuration that can be altered by an iteration of the "design flow"—altering circuit design with new attribute, performing verification, performing synthesis, performing another verification, performing place-and-route, and configuring a programmable logic device with the circuit design. The dynamic attributes 720 can be alter via an iteration of the "design flow" as well as by issuing a new configuration file or command to an already configured programmable logic device, for example, via a JTAG port of the already configured programmable logic device.

The static attributes 710 can include a name field 711 to define which validation packet client in the validation system the static and dynamic attributes panes 710 and 720 currently reference. The static attributes 710 can include a type field 712 to define which type trigger event detection the corresponding validation packet client is to perform. For example the type field 712 can be populated to define a pattern matching detection type, a meta-stability glitch detection type, or the like. The static attributes 710 can include a trace depth field 713 to define a size of a trace buffer in the corresponding validation packet client. The static attributes 710 can include a trace clock field 714 to define a clock signal for the corresponding validation packet client to receive, such as a design clock signal. The static attributes 710 can include a trace clock frequency filed 715 to define a frequency of the clock signal defined in the trace clock field 714. The static attributes 710 can include a trigger signals field 716 to define which trigger signals for the corresponding validation packet client to receive, which can be included in a trigger signal list 717. The static attributes 710 can include a trace signals field 718 which trace signals for the corresponding validation packet client to receive, which can be included in a trace signal list 719.

The dynamic attributes 720 can include a trigger enable field 721 to define whether the corresponding validation packet client enables analysis of received trigger signals. The dynamic attributes 720 can include a trace enable field 722 to define whether the corresponding validation packet client enables recordation of received trace signals. The dynamic attributes 720 can include a trace marker field 723 to define a marker for the trace signals received by the corresponding validation packet client. The dynamic attributes 720 can include a trigger expression field 724 to define trigger expressions or conditions that, if met by one or more of the trigger signals, can elicit a trigger event. The trigger expressions can be populated into an expression list 725.

Figure 8:
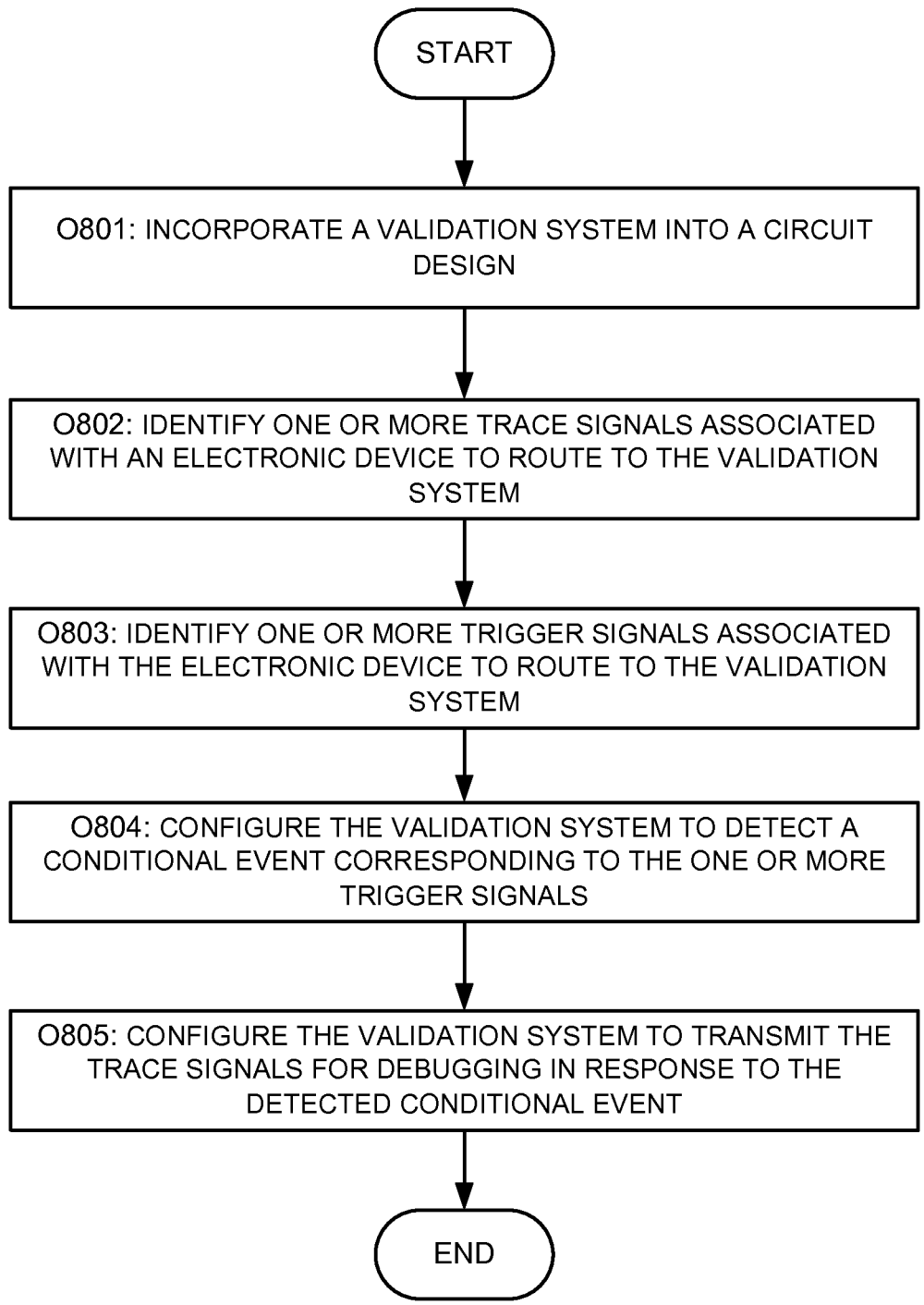
FIG. 8 illustrates an example flowchart for incorporating and configuring a validation system in a circuit design according to various embodiments of the invention.

FIG. 8 illustrates an example flowchart for incorporating and configuring a validation system in a circuit design according to various embodiments of the invention. Referring to FIG. 8, in a block 801, a design tool can incorporate a validation system into a circuit design. The validation system can have various different configurations, for example, comprising a single validation packet client or have a ring of multiple validation packet client coupled in a serial pipeline fashion, or the like.

In a block 802, the design tool can identify one or more trace signals associated with an electronic device to route to the validation system. The trace signals can correspond to operational signals from the electronic device that the validation system can record. The trace signals can include packetized communication, binary data, power signaling, clock signaling, or any other signal generated, received, transmitted, or exchanged by the electronic device.

In a block 803, the design tool can identify one or more trigger signals associated with the electronic device to route to the validation system. The trace signals can correspond to operational signals from the electronic device that the validation system, which can include packetized communication, binary data, power signaling, clock signaling, or any other signal generated, received, transmitted, or exchanged by the electronic device.

In a block 804, the design tool can configure the validation system to detect a conditional event corresponding to the one or more trigger signals. For example, the validation system can include assertion logic to review the received trigger signals and determine whether the trigger signals include a specific signature or embedded bit stream, whether the trigger signals are set in a particular state, whether the trigger signals have transitioned between a particular set of states in a preset order or with a preset timing, or any other discernable trigger signal pattern. In some embodiments, the design tool can configure the validation system after the circuit design has been configured into a programmable logic device, for example, by providing an assertion configuration capable of configuring the assertion logic to the validation system.

In a block 805, the design tool can configure the validation system to transmit the trace signals for debugging in response to the detected conditional event. The design tool can identify semantics, syntax, and format of messages including the trace signals to be transmitted for debugging. The design tool also can identify timing of when the messages can be transmitted for debugging, for example, when the validation system transmits the messages over a shared resource, such as a serial packet bus.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

Conclusion

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
incorporating, by a computing system, a validation system into a circuit design, wherein the validation system includes multiple validation devices configured to monitor at least a portion of an electronic device described in the circuit design, and wherein the validation devices are arranged in a serial pipelined configuration with each of the validation devices configured to transmit signals on each of a plurality of communication buses;

identifying, by the computing system, trace signals associated with the electronic device to route to the validation system; and configuring, by the computing system over one of the communication buses in the serial pipelined configuration, the validation system to detect one or more conditional events from one or more trigger signals routed to the validation system from the electronic device, wherein the validation system is configured to transmit at least one of the trace signals associated with the electronic device, over another one of the communication buses in the serial pipelined configuration, for debugging in response to a detection of at least of the conditional events.

2. The method of claim 1, wherein at least one of the conditional events corresponds to a state of the one or more trigger signals.

3. The method of claim 2, wherein configuring the validation system to detect the conditional event further comprising providing an assert configuration to the validation system, wherein the assert configuration is configured to configure circuitry in the validation system to detect when the one or more trigger signals enter the state corresponding to the at least one of the conditional events.

4. The method of claim 3, wherein providing the assert configuration to the validation system further comprising transmitting the assert configuration to a programmable logic device configured to implement the validation system and the corresponding electronic device based on the circuit design.

5. The method of claim 1, wherein each validation device includes a trace buffer configured to store trace signals received from the electronic device, an assert logic device configured to detect at least one of the conditional events corresponding to operation of the electronic device, and a packet generator configured to transmit at least one of the trace signals stored in the trace buffer in response to the conditional event detected by the assert logic device.

6. A system comprising:
an electronic device configured to perform electrical operations; and
a validation system including multiple validation devices arranged in a serial pipelined configuration with each of the validation devices configured to transmit signals on each of a plurality of communication buses, wherein the validation system is configured to monitor trace signals associated with the electronic device, wherein the validation system is configured, over one of the communication buses in the serial pipelined configuration, to detect one or more conditional events from at least one trigger signal routed to the validation system from the electronic device, and wherein the validation system is configured to transmit, over another one of the communication buses in the serial pipelined configuration, one or more of the trace signals associated with the electronic device for debugging in response to a detection of at least of the conditional events.

7. The system of claim 6, wherein each validation device includes a trace buffer configured to store one or more of the trace signals received from the electronic device, an assert logic device configured to detect at least one of the conditional events corresponding to operation of the electronic device, and a packet generator configured to transmit at least one of the trace signals stored in the trace buffer in response to the conditional event detected by the assert logic device.

8. The system of claim 6, wherein the electronic device and the validation system are described in a circuit design.

9. The system of claim 6, wherein the electronic device and the validation system are implemented in a programmable circuit device according to a circuit design.

10. An apparatus comprising at least one computer-readable memory device storing instructions configured to cause one or more processing devices to perform operations comprising:

incorporating a validation system into a circuit design, wherein the validation system includes multiple validation devices configured to monitor at least a portion of an electronic device described in the circuit design, and wherein the validation devices are arranged in a serial pipelined configuration with each of the validation devices configured to transmit signals on each of a plurality of communication buses;

identifying trace signals associated with the electronic device to route to the validation system; and configuring, over one of the communication buses in the serial pipelined configuration, the validation system to detect one or more conditional events from one or more trigger signals routed to the validation system from the electronic device, wherein the validation system is configured to transmit at least one of the trace signals associated with the electronic device, over another one of the communication buses in the serial pipelined configuration, for debugging in response to a detection of at least of the conditional events.

11. The apparatus of claim 10, wherein at least one of the conditional events corresponds to a state of the one or more trigger signals.

12. The apparatus of claim 10, wherein configuring the validation system to detect the conditional event further comprising providing an assert configuration to the validation system, wherein the assert configuration is configured to configure circuitry in the validation system to detect when the one or more trigger signals enter the state corresponding to the at least one of the conditional events.

13. The apparatus of claim 12, wherein providing the assert configuration to the validation system further comprising transmitting the assert configuration to a programmable logic device configured to implement the validation system and the corresponding electronic device based on the circuit design.

14. The apparatus of claim 10, wherein each validation device includes a trace buffer configured to store trace signals received from the electronic device, an assert logic device configured to detect at least one of the conditional events corresponding to operation of the electronic device, and a packet generator configured to transmit at least one of the trace signals stored in the trace buffer in response to the conditional event detected by the assert logic device.

* * * * *